United States Patent [19]

Wang et al.

[11] Patent Number: 4,734,776

[45] Date of Patent: Mar. 29, 1988

[54] READOUT CIRCUIT FOR AN OPTICAL SENSING CHARGE INJECTION DEVICE FACILITATING AN EXTENDED DYNAMIC RANGE

[75] Inventors: Samuel C. Wang, Manlius; David N. Ludington, New Hartford, both of N.Y.

[73] Assignee: General Electric Company, Syracuse, N.Y.

[21] Appl. No.: 896,648

[22] Filed: Aug. 15, 1986

[51] Int. Cl.$^4$ .............................................. H04N 3/14
[52] U.S. Cl. ........................... 358/213.31; 358/213.19; 358/211
[58] Field of Search ....................... 358/213.31, 213.12, 358/213.19, 211; 357/30 H

[56] References Cited

U.S. PATENT DOCUMENTS

| 4,316,221 | 2/1982 | Swab .............................. 358/213.31 |
| 4,407,010 | 9/1983 | Baji et al. ....................... 358/213.19 |
| 4,682,236 | 7/1987 | Wang et al. ...................... 358/213.31 |

*Primary Examiner*—Jin F. Ng
*Assistant Examiner*—Stephen Brinich
*Attorney, Agent, or Firm*—Richard V. Lang; Carl W. Baker; Fred Jacob

[57] ABSTRACT

The invention relates to a charge injection device for optical sensing including a novel readout circuit facilitating an extended dynamic range. The invention has primary application to linear arrays for IR sensing.

Sensitive, low-level operation is achieved in a primary readout means by allowing the charge to accumulate in the potential well of the individual sensor elements over the line period with each element being reset at the pixel readout rate and by using a charge injection pulse to clear stored charge from the individual sensor elements. A secondary readout means is also provided in which the charge is allowed to accumulate over a period not exceeding the pixel readout interval for unsaturated large signal operation and by sensing the change in depth of the potential well. The two readout means are combined in the eventual display to provide an improvement of typically three orders of magnitude in the dynamic range of the CID.

4 Claims, 8 Drawing Figures

INPUT/OUTPUT TRANSFER CHARACTERISTICS

FIG. 5C $Q_W = (CO)(X) =$ CHARGE IN THE POTENTIAL WELL BEFORE READOUT.
$m1 = 1/CM$, $m2 = 1/CO$, $m3 = -1/CA$; $CM = CO\ CD/(CO + CD)$
$VI' =$ UNLOADED INJECTION VOLTAGE.
FOR CHARGE CLEARING, $VC = VR + VI'$
FOR CHARGE SKIMMING, $VC > VR + VI'$

READOUT CIRCUIT FOR AN OPTICAL SENSING CHARGE INJECTION DEVICE FACILITATING AN EXTENDED DYNAMIC RANGE

BACKGROUND OF THE INVENTION

1. Field of the Invention

The invention relates to charge injection devices (CID) for optical sensing and more particularly to an improved readout circuit for an optical sensing CID array facilitating an extended dynamic range.

2. Prior Art

Optical sensing CID arrays are well known. They may take the form of area arrays or linear arrays and may respond to visible light, or to light of longer wavelength than visible wavelengths such as infrared (IR). In linear IR sensing arrays, the sensor substrate material is often Indium Antimonide (InSb) or mercury cadmium telluride (HgCdTe). These materials are compound semiconductors which are doped to achieve a desired impurity level. When exposed to IR, photon collisions create electron-hole pairs in the substrate. In the usual construction, a common electrode is applied to the under surface of the substrate, and an oxide layer is applied to the upper surface of the substrate, followed by a plurality of individual transparent electrodes each associated with a particular sensor element. The sensor element, with its insulated electrode, when suitably reversely biased, stores IR induced charges (the holes) in a "potential well", to use the conventional description.

Conventionally, all sensor elements are continuously exposed to the optical flux, so that when a "potential well" is present in the element, optically induced charges are stored. If the charges accumulate with the bias disconnected, the accumulating charge reduces the depth of the potential well. This reduction in depth may be directly sensed over a given period of time while the bias is disconnected and used as an indication of the intensity of the optical flux. However, this is not ordinarily done, because there is a low limit to the time that charge may be accumulated with reasonable linearity, and therefore this mode of operationa has a low limit to usable sensitivity.

A convenient charge integration time for optimum sensitivity in the time required to readout all the elements of the array in succession. Ideally, the optically induced charges should be allowed to accumulate on each element for the total period required to read out all the other elements (i.e. the line time approximately) before returning to the same sensor element for a second readout.

The period required for a line is the time required for the readout of all n sensor elements, i.e. the multiple of the time for taking a reading at a single sensor element (i.e. the pixel time) multiplied by the number of such elements or pixels. The pixel time is set by the time constants of the sensor element and the readout circuitry. In each pixel time: time is allocated for resetting the sensor element and the readout circuitry to a standard value (VR); time is allocated for taking a first sample prior to injection of the accumulated charge into the sensor substrate; time is allocated for charge injection, and finally time is allocated for taking a second sample, before going on to the next element.

The known readout technique which is described in the copending U.S. application Ser. No. 811,474 (35-EL-1676) of Messrs Wang, Swab, Winn and Gibbons, filed Dec. 20, 1985, and entitled "A READ AND CLEAR READOUT CIRCUIT AND METHOD OF OPERATION OF AN IR SENSING CHARGE INJECTION DEVICE", allows for charge integration over the line time, the charge integration process being linearized by "resetting" the sensor element to a suitable reverse bias at the pixel rate. The periodic resetting allows image charges to flow to the gate to reduce the reduction in depth of the potential well produced by the charge accumulated during the prior pixel level when the sensor element was "floating". When the known readout technique is optimized, a linear dynamic range of three orders of magnitude may be achieved.

Granting that the dynamic range of the readout circuitry is optimized for low level signals, the readout circuit is overloaded when strong signals are present. Overloading is a disadvantage which the present invention seeks to avoid.

SUMMARY OF THE INVENTION

Accordingly, it is an object of the present invention to provide an improved readout circuit in a charge injection device (CID) for optical sensing.

It is another object of the invention to provide a readout circuit in a CID for optical sensing facilitating an extended dynamic range.

It is a further object of the invention to provide a readout circuit in a CID for IR sensing facilitating an extended dynamic range.

It is still another object of the invention to provide a readout circuit in a CID linear array for IR sensing facilitating an extended dynamic range.

These and other objects of the invention are achieved in a charge injection device (CID) for optical sensing. In the CID, n optical sensor elements ($E_{1-n}$) are provided arranged in an array on a substrate, each element when reversely biased and suitably pulsed, forming a potential well in which optically induced charges may be stored. The optically induced charge which accumulates with the bias disconnected causes a reduction in depth of the potential well, the depth of which may be reestablished by periodically resetting the bias over a prolonged charge integration period. The optically induced charge is detectable after periodic resetting (over the prolonged charge integration period) by application of an injection pulse adequate to collapse the potential well. It is also detectable without injection in a shorter period during which the sensor element is not reset.

The readout circuit comprises n input terminals ($IT_{1-n}$) each connected to one of the n sensor elements ($E_{1-n}$), a primary sensing line, a secondary sensing line, and a primary and a secondary signal output; means for periodically resetting the sensor elements and the primary and secondary sensing lines to the reverse bias, primary pulse injection means (CI) coupled to the primary sensing line and periodically to each (jth) sensor element for removing stored charge from a selected element, the initial transient collapsing the potential well, and the final transient reestablishing the potential well, and a primary and a secondary readout means connected respectively to the primary and the secondary sensing lines.

The readout circuit further comprises timed switching means for establishing a primary and a secondary select interval respectively for each (jth) sensor element) the secondary select interval of the jth sensor element occurring during the primary select interval of the (j+1)th sensor element.

The primary sensing line, in each sensor element readout interval, after resetting, is connected to the jth sensor element during the primary select interval. Then the jth sensor element is successively sampled for primary readout, pulsed by the primary charge injection means (CI), and resampled for primary readout to provide the primary readout signal. This allows the charge integration period for primary readout to be approximately (n−1) sensor element readout intervals (i.e. slightly less than the line time) with each sensor element being reset at the pixel rate for sensitive low signal operation.

The secondary sensing line, in each sensor element readout interval ($t_p$), after resetting, is connected to the (j−1)th sensor element during the secondary select interval. Then the (j−1)th sensor element is twice sampled by the secondary readout means over a charge integration period ($t_{si}$) to provide the secondary readout signal. This allows the charge integration period for secondary readout to take place within a single sensor element readout interval for unsaturated large signal operation.

In processing the primary and secondary readout signals, one or the other is used from each pixel in making up the signal used in the final display. When the secondary readout signal is employed from a pixel, it is amplified by the appropriate factor to achieve linearity in the output display.

BRIEF DESCRIPTION OF THE DRAWINGS

The inventive and distinctive features of the invention are set forth in the claims of the present application. This invention itself, however, together with further objects and advantages thereof, may best be understood by reference to the following description and accompanying drawings in which:

FIGS. 5A, 5B and 5C deal with the operation of the invention in deriving the signal from a single element of the sensor array.

DESCRIPTION OF THE PREFERRED EMBODIMENT

Figure 1:
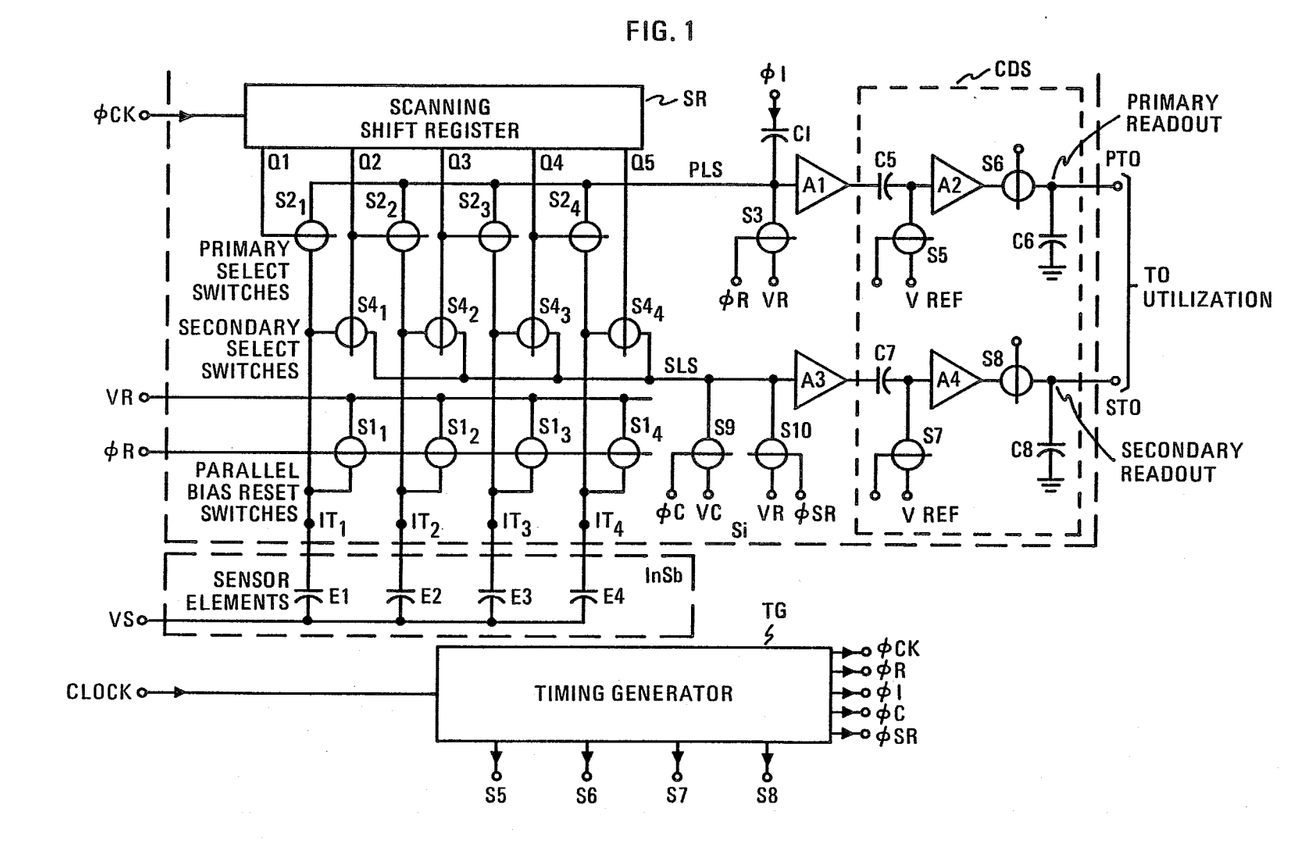
FIG. 1 is a diagram of a novel charge injection device (CID) for IR sensing including an IR sensor and an AC-coupled injection (ACI) readout circuit, which in addition to eliminating readout circuit lag, separately derives low level and high level signals facilitating a two orders of magnitude extension of the dynamic range of the CID.

Referring now to FIG. 1, a linear charge injection device (CID) for infrared (IR) sensing is shown. The CID combines a linear IR sensor array with a novel readout circuit which, in electronically scanning the array, facilitates a two orders of magnitude extension of the dynamic range. The sensor array is formed on a first integrated circuit of IR sensitive material such as Indium Antimonide (InSb) or Mercury Cadmium Telluride (HgCdTe), while the readout circuit is formed on a second, separate integrated circuit of silicon (Si).

The CID forms a portion of a larger system in which an infrared image of an object field is formed. The readout circuit, which electroncially scans the elements of the array, permits the formation of an individual line of an image of the object field. The resolution of the image measured along the line of elements is proportional to the number of elements. To complete the image, mechanical means are provided to cause the line of the object field imaged on the CID array to be swept in a direction transverse to the line image. A full area image of the object field is then formed by supplying the outputs of the readout circuit taken at successive imaging positions to a suitable integrative display device. Here again the resolution of the image transverse to the line image is proportional to the number of imaging positions. Dependent upon application, the image display provides means to store elements (pixels) of the image for an appreciable portion of the scanning interval to create a full area image of the object field. The persistence of the image is optimized to suit the nature of the display.

The IR sensing array consists of an "essentially" linear sequence of individual sensing elements of which four are illustrated ($E_1$ to $E_4$). It should be understood that the actual array will entail a larger number of elements (e.g. 64, 128, 256, 512, etc.), and that in the linear sequence, they may be alternately offset to the right or left of the line to permit higher resolution. The individual sensor elements are two terminal devices, which may be approximately represented as in FIG. 1 by capacitors. A more descriptive representation of a sensor element is provided in FIG. 5A, in which the representation includes two capacitors CO and CD and optionally a diode D and variable voltage source (VD).

The sensor array has an IR active substrate typically 0.020 inch thick which has a resistivity suitable for CID operation. The undersurface of the substrate is electroded to provide a contact common to all sensor elements leading to a terminal connected to a voltage source VS. The terminal may be led to the top surface of the substrate. The region of the substrate which is active in the IR sensing, is a thin region, rarely more than a few microns in thickness, at the top near the interface with an oxide layer (yet to be described).

The second terminal for each element of the sensor array is provided by a metal-insulator-semiconductor (MIS) gate of which the uppermost layer is an IR transparent conductive layer of chromium (i.e.the "M" of "MIS"), and the undermost layer of insulating silicon dioxide (i.e.the "I"). The "S" is the IR sensitive semiconducting substrate material (e.g. InSb). The insulating $SiO_2$ layer and the uppermost portion of the InSb enter into the IR sensing mechanism. Charges which are created in the IR sensing process are said to be stored in a "potential well" at their interface.

In addition to the "gates", patterned metallizations are required to provide the electrical connections illustrated in FIG. 1 for connecting the IR sensor elements to pads on the InSb chip for further connection to pads on the silicon readout chip.

Although the drawing suggests that the preferred application of the invention is to a "linear" array of sensor elements, it is equally applicable to a single-gate area array. The remainder of FIG. 1 deals with the novel readout circuit in which the dynamic range is extended by at least two orders of magnitude.

The readout circuit which forms a second part of the CID device, includes a timing generator (TG), and a scanning shift register (SR) operating at rates commensurate with the number of "pixels" in the image. The readout circuit is typically formed by a MOS process on a silicon substrate. It electrically scans the successive elements of the sensor array, controls the double sampling required to read out each sensor element and delivers two signals proportional respectively to the low intensity and to the high intensity IR signals developed at the successive sensor elements. Each signal is in a serial format, and each is coupled along a single path to corresponding low (PTO) or high (STO) level CID output terminals.

The external signal connections to the readout circuit include a number (n) of input terminals ($IT_{1-n}$) four only being illustrated, each connected to one of a corresponding number (n) of elements in the sensor array and the two CID output terminals PTO (primary output terminal) and STO (secondary output terminal) mentioned above.

The readout circuit further comprises a first bias voltage source (VR), n controllable bias reset switches $S1_{1-n}$ for periodically biasing the n sensor elements of the array to integrate the charge created by IR exposure; a switch (S3) and a switch (S10) for periodically applying the voltage source (VR) to the primary sensing line (PLS) and secondary sensing line (SLS), respectively; and an n fold plurality of sensor primary select switches $S2_{1-n}$ for selecting the sensor element to be connected to the primary sensing line (PLS) for readout, a second voltage source (VC) having a value in excess of VR selected to remove charge remaining after primary readout from said well to a clear or skim condition, and n controllable secondary select switches ($S4_{1-n}$) for periodically clearing/skimming each sensor element through switch (S9) and providing secondary readout, an amplifier (A1) coupled to the primary sensing line, an amplifier (A3) coupled to the secondary sensing line, and a correlated double sampling circuit (CDS) having two separate sections by which the primary and secondary amplified sensor outputs, derived sensor element by sensor element, are processed to obtain the low level and high level outputs at terminals PTO and STO respectively.

The readout circuit just described is controlled by the timing generator TG. The timing generator is itself timed by a masterclock. It produces the periodic pulse waveform phi ck (not illustrated) having a pulse period equal to the pixel interval $t_p$ (FIGS. 2 or 5C) and a pulse repetition rate equal to the pixel scanning rate for operating the scanning shift register SR. The waveform phi ck is used to derive the waveform $Q_j$, which appears at each shift register output terminal. The waveform $Q_j$ controls the jth sensor primary select switch $S2_j$ and the (j−1)th secondary select switch $S4_{j-1}$. The timing generator TG also produces the four waveforms illustrated in FIG. 2, which include the waveform phi R for controlling the reset switches $S1_{1-n}$ and S3, the waveform phi I for implementing charge injection through capacitor CI, the waveform phi C for controlling the clear switch, and the waveform phi SR for controlling the secondary reset switch. Finally, the timing generator TG produces the DC restore (S5, S7) and the sample and hold (S6, S8) waveforms for the correlated double sampling circuit whose timing is best seen in FIG. 5C.

Figure 2:
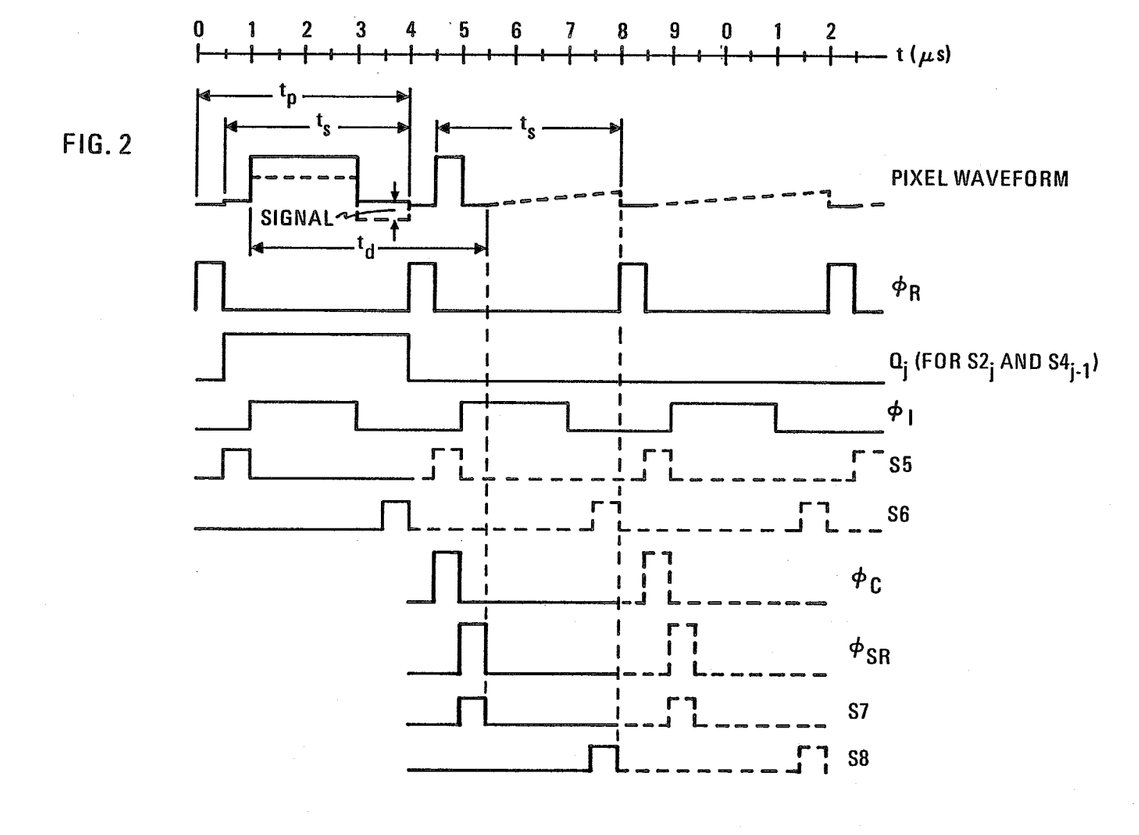
FIG. 2 illustrates the timing waveforms applicable to an element of the sensor array in ACI readout, clear/skim operation, and dual output derivation.

In the readout circuits, the bias voltage (VR) is applied to all sensor elements at the element readout (pixel) rate to maintain the charge storage capacity in all elements. As seen in FIG. 2, the (jth) sensor element $E_j$ is connected to the jth input terminal $IT_j$ of the input terminal set ($IT_{1-n}$) of the readout circuit. The jth sensor input terminal $IT_j$ is connected to one terminal of the jth reset switch ($S1_j$) and to one terminal of the jth select switch ($S2_j$) for primary readout and to one terminal of the jth secondary select switch $S4_j$. The other terminal of the bias reset switch ($S1_j$) is connected to the bias source (VR). The switches $S1_j$ and S3 are controlled by the reset waveform phi R (see FIG. 2) which closes the switches and connects the jth sensor element and the primary sensing line to the bias source (VR) when the reset waveform goes high. The reset waveform goes high at the start of the element readout interval (period S1, FIG. 5C; see pixel waveform, FIG. 2), and remains high during a preliminary portion (0.5 microsecond) of the element readout interval ($t_p$).

The IR induced charge, accumulated during the integration period (n−1 pixel intervals) at the sensor elements, is removed element by element and its removal is sensed on the primary sensing line (PLS) coupled to the input of amplifier A1. Sensing the stored charge utilizes the injection pulse phi I and the primary select switches ($S2_{1-n}$) with timing being provided by the timing generator TG and shift register SR.

The primary select switches $S2_{1-n}$, whose first terminals are connected to the sensor elements ($E_{1-n}$), have their second terminals connected to the primary sensing line (PLS) leading to the input of the amplifier (A1). The control inputs of the primary select switches are connected in order of the successive shift register (SR) terminals. The primary sensing line (PLS) is also connected to one terminal of the amplifier reset switch S3 whose other terminal is connected to the voltage source (VR), and to one terminal of the injection coupling capacitor CI whose other terminal is connected to the injection pulse terminal phi I. The secondary select switches $S4_{1-n}$, whose first terminals are connected to the sensor elements ($E_{1-n}$), have their second terminals connected to the secondary sensing line (SLS) leading to the input of the amplifier (A3). The control inputs of the secondary select switches are similarly connected in order of the successive shift register (SR) terminals, only one stage behind that of the primary select switches (to perform the so-called "reach-back" function). The secondary sensing line (SLS) is also connected to one terminal of the clear switch S9 whose other terminal is connected to the voltage source (VC), and to one terminal of the bias reset switch S10 whose other terminal is connected to the voltage source (VR).

Resetting of the amplifier inputs PLS and SLS by the switches (S3, S10) occurs once for each sensing operation. The resetting of the primary amplifier input is done in synchronism wiht the resetting of the bias resetting switches S1$_{1-n}$, under control of the reset waveform phi R. The resetting of the secondary amplifier input by switch S10 is done one clock count later under the control of the waveform phi SR. Resetting standardizes the charge of the stray capacitance CA associated with the sensing lines and amplifier inputs, and makes the reading of each element more accurate and less subject to variation due to variations in the signal level of the previously read element (i.e. it avoids cross talk).

The scanning shift register (SR), which selects successive sensor elements for readout, is controlled by the timing generator itself timed by a clock (as previously noted) to produce successively spaced logical highs on the n output terminals (five terminals only being illustrated), which are individually connected to the control terminals of the primary select switches (S2$_{1-n}$) and the secondary select switches (S4$_{1-n}$).

The primary readout of the individual sensor elements, will be described prior to describing the clear/skim operation and secondary readout. (The clear/skim operation and secondary readout take place for the jth sensor element on the (j+1)th readout interval and involve the secondary select switches S4$_{1-n}$, the clear/skim switch S9 and the bias reset switch S10.).

The primary readout may be described with reference to the waveforms of FIG. 2 and in particular the pixel waveform. When the reset waveform phi R goes high at the beginning of the readout interval for the jth pixel, switch S3 connects the primary sensing line (PLS) to VR. Switch S1$_j$, controlled by the same waveform, is also synchronously resetting the jth sensor element to VR. Closure of S3 charges the stray capacitance CA at the primary sensing line (PLS), including the stray capacitance at the output terminals of the switches S2$_{1-n}$, S3, and at the input of the amplifier A1, to the voltage of VR. Resetting the sensing line and sensor element continues for roughly 0.5 microsecond (one clock count). At the end of the reset, the scanning waveform (Q$_j$) from the shift register goes high, turning on the primary select switch S2$_j$. The select switch S2$_j$, now turned on, couples the selected sensor element to the primary sensing line. The first sample is completed during the first clock count (S5) that the primary select switch is closed, which is followed by a 2-microsecond injection pulse (phi I) applied through the injection coupling capacitor CI. This causes the potential well in the selected sensor element to collapse, and the charge stored in the sensor element flows into the substrate, momentarily increasing the potential on the selected sensor element, as generally illustrated in FIGS. 5B and 5C. The second sample (S6) is taken about 1 microsecond after injection when the waveform is properly settled, which concludes the primary readout.

In primary readout, the integration time, during which charges accumulate in the potential well, is approximately equal to the line time (i.e. the period required to scan the "n" sensor elements in the array), less one pixel time. To achieve linear integration of the carriers over the line time, a reverse bias and periodic pulsing are required. The reverse bias insures the formation of a depletion region in the MIS device, in which most photon induced electron-hole pairs are generated. The leading edge of the injection pulse collapses the potential well and injects the stored charge out of the well and into the substrate while an output sample is taken, and terminates the previous integration cycle. The trailing edge of the injection pulse creates a potential well, and initiates the next integration cycle. Meanwhile, "reset" pulses are periodically applied to each pixel at the pixel readout rate throughout the long integration cycle to sustain the potential well and improve charge integration.

The MIS characteristics are inherently non-linear. Periodic resetting of the reverse bias on the sensor element at the pixel readout rate sustains the potential well created by the injection pulse during the long integration cycle. By sustaining the potential well it improves the linearity of optical detection. Without a constant reverse bias, the voltage on the MIS gate increases with charge integration, diminishing the potential well depth and the charge storage capacity. Application of the reset voltage maintains the reverse bias on the MIS gate sustaining the potential well regardless of the accumulated charge. Resetting does not affect the charge in the potential well because the charge is stored at the insulated inversion layer of the MIS interface. Integration of the stored charge for a given (jth) sensor element, therefore, continues after readout of that sensor element through readout of all the other (n−1) sensor elements. As each sensor element is read out, the reset pulse is applied to all the sensor elements. Thus every sensor element is reset at the pixel interval rate, although the integration period for each sensor element goes from injection pulse to injection pulse, at the line interval rate.

Figure 5A:
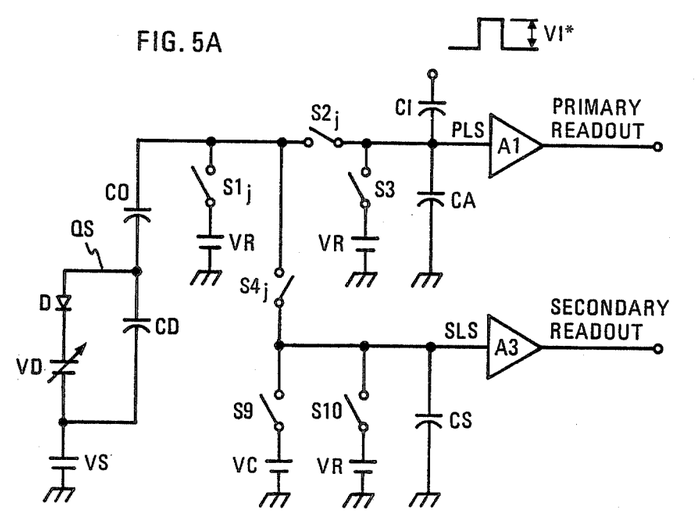
FIG. 5A being an equivalent circuit representation of the sensor element and the readout circuit.
Figure 5B:
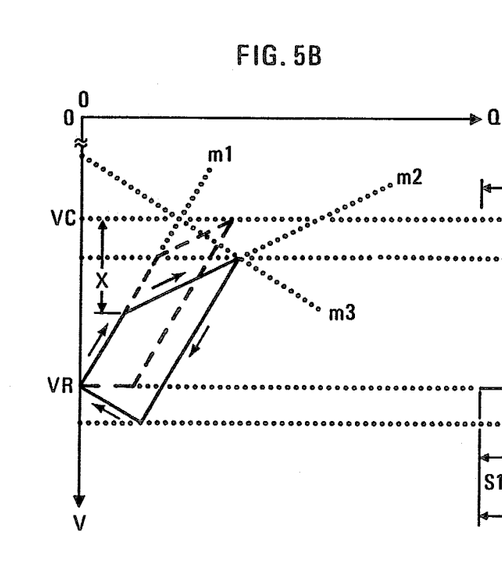
FIG. 5B being a V/Q diagram of successive electrical states in the readout process including the novel readout and clear/skim operation.
Figure 5C:
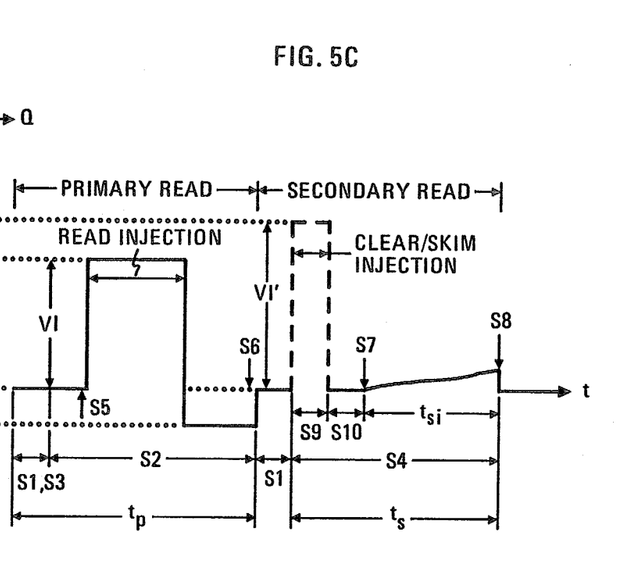
FIG. 5C being an idealized electrical waveform illustrating both the voltage at the sensor element and at the inputs to the preamplifiers during the readout process.
Figure 6:
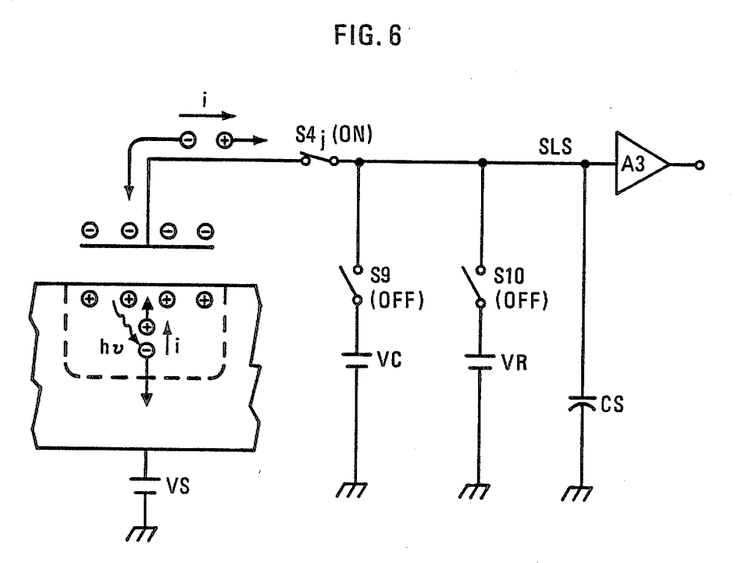
FIG. 6 is a simplified equivalent circuit representation of a sensor element, illustrating the physical mechanism of charge generation in the potential well of the sensor element, and its induced current in the readout circuit.

The role of the reverse bias and periodic reset pulsing may be explained by resort to the FIG. 5A equivalent circuit representation, and the "potential well" visualization similar to FIG. 6. In FIG. 5A, the sensor element is represented as two serially connected capacitors CO and CD, with a variable capacitor VD and a diode D shunting the capacitance CD. For purposes of the present discussion, the equivalent representation need only consist of the two serially connected capacitors CO and CD.

During exposure to light, electron-hole pairs are created in the depletion region of the sensor element (as illustrated in FIG. 6). If reverse bias is provided, the positive charge collects at the oxide interface, and negative charges flow to the substrate. The device acts as a pair of serial capacitors with positive charge tapered at the inversion layer of the MIS interface, if the negative potential is adequate to reversely bias the vertical diode and preclude a conductive connection to the substrate. This is generally described as forming a "potential well". As the charge accumulates, the reverse voltage across the lower capacitor (CD) is reduced tending to approach to the point that the virtual diode may conduct.

The charge integration process, and particularly the role of periodic reset pulsing during primary readout, may be explained in somewhat greater detail.

The reverse bias creates an electric field across the sensor. Within the oxide there are no free charges, and it may be treated as a simple dielectric. Within the semiconductor, there are excessive free majority carriers. In an n material, there are free excessive electrons. The application of negative voltage on the gate electrode, by electrostatic repulsion drives the free electrons away from the surface adjacent to the oxide, i.e. the "interface", and a depletion region, depleted of free electrons forms to some depth below the oxide-semiconductor interface. The effect of the depletion of electrons is to leave a depletion region with a net positive space charge. In the CID operation, the depth of the depletion region is dependent on the magnitude of the reverse bias voltage and the transient pulse. The bottom edge of the depletion region may be regarded as the lower electrode of the semiconductor equivalent capacitor—the depletion region being the dielectric.

In the equilibrium condition, the depletion region increases with the reverse bias voltage until the surface potential reaches a threshold when the charge at the interface is inverted from majority carriers to minority carriers. The transient effect on the free minority carriers due to the injection pulse constitutes a "potential well". The depth of the potential well is a measure of the charge storage capacity of the device.

In the absence of a photon flux, the application of a forward injection pulse on the reverse bias voltage establishes a deep depletion region and charges imaging the positive charge in the depletion region form at the gate. When the reverse bias voltage is disconnected, the gate electrode retains its image charge in view of the high insulating quality of the oxide, but the open circuit of the gate prevents new image charges from flowing to or from the gate electrode, should the charge distribution within the semiconductor change.

After disconnection of the bias, the charge distribution changes and the depletion region gradually decreases, due primarily to leakage within the semiconductor. For example, this distribution can change because of the "collection" of mobile charges ("holes") generated thermally within the depletion region. Electron-hole pairs are generated, the holes being driven by the field to the inversion layer at the interface, and the electrons being driven to the neutral bulk.

The presence of a photon flux, assuming that the reverse bias voltage is disconnected, accelerates the rate of reduction of the depletion region. The reduction will not be instantaneous because, under the influence of the prior reverse bias voltage, charges would have been created and capacitively stored. The presence of photon flux, however, hastens the reduction in depth of the depletion region. The photon flux creates electron-hole pairs additional to those created thermally. Due to the electric field of the space charge, the electrons continue going to the neutral bulk, and the holes continue going to the oxide interface. The presence of the new holes at the oxide interface tends to neutralize the space charge field that would support the depletion region. The voltage across the oxide holds constant, but as holes collect at the oxide interface, attracted by the electrons stored on the gate electrode, the semiconductor region is screened, thereby reducing the voltage across the depletion region. One might say that the charges are added to the potential well and collect at the oxide interface. With growing numbers of photon-induced carriers, the depth of the depletion region is reduced. The device gradually "saturates" by which one means that the negative voltage on the gate rises sufficiently across the semiconductor to reduce the back bias, and the depth of the potential well decreases.

If the applied reverse bias voltage is not removed or is periodically reapplied over the long integration period during exposure to light, the situation differs. Assuming reapplication of the "reset" voltage at necessary intervals, the depth of the potential well will shrink in each off period and be reset at each reapplication of the bias voltage. Periodic resetting will add sufficient negative charges to the gate electrode to neutralize the charge at the interface and to maintain a constant depth of the potential well while holding a growing number of photon-induced charge.

Periodic resetting tends to avoid saturation effects. The maximum charge at the interface is increased over the unrest case and photon flux sensing retains linearity during the process of scanning the other $(n-1)$ pixels. Only at high flux levels does saturation occur, and in that event, secondary readout, as will be described, permits linear sensor operation to significantly higher flux levels.

As earlier suggested, the preferred embodiment has the feature of avoiding readout lag due to capacitance at the node (CA) at the preamplifier input. In the process of reading a voltage equilibrium, the charge in the potential well will not all flow out of the sensor element but will rather divide by a fraction $alpha_R$ dependent on the capacitance of the sensor element (CO and CD) and the capacitance at the node (CA) including the sensing line and the preamplifier (A1) input. This fraction $alpha_R$ which may be called the readout circuit lag, equals:

$$alpha_R = eta_R alpha_L = [CO/(CO+CD)][CO/(CO+CA)],$$

$eta_R = CO/(CO+CD)$ being the depletion loading efficiency and $aplha_L = CO/(CO+CA)$, the injection pulse loading coefficient.

The retained charge causes a reduction in the amount of IR induced signal charge which can be withdrawn from the sensor and coupled to the node to which the sense line and preamplifier are coupled.

As suggested in the above expression, optimizing the readout circuit for minimum readout lag would mean increasing the nodal capacitance and tend to increase the noise equivalent charge, which is approximately proportional to the product of a virtual noise generator (VN) (the preamplifier itself) and the input node capacitance (C). The noise equivalent charge (QN) which equals VN $\times$ C should accordingly be very small for optimizing signal to noise ratio. This may be also explained by noting that the larger the capacitance at the node, the smaller the signal applied to the preamplifier input. Accordingly, the present embodiment employs a method of allowing a low noise readout utilizing a conveniently low input capacitance on the sense line and at a subsequent time removes the charge attributable to readout circuit lag so that in fact a reading may be taken in which readout circuit lag is zero. As will now be subsequently explained, the present embodiment achieves an extended dynamic range by at least two orders of magnitude using the secondary readout.

The clear/skim operation and secondary readout entail the secondary select switches $S4_{1-n}$, a clear/skim switch S9 with a voltage source VC which is larger than the voltage source VR being selected to remove the charge remaining after primary readout, a secondary reset switch S10 with the voltage source VR, and periodic timing provided by the shift register SR. More particularly, one terminal of each secondary select switch $S4_j$ is connected (as earlier noted) to a corresponding jth sensor element in the sensor array. The other terminal of each switch is connected to the secondary sensing line (SLS). The control terminal of each (jth) switch is then connected to the $(j+1)$th terminal of the scanning shift register. Thus, in the overall scanning operation, the primary readout process of the jth sensor element takes place at the same time that the clear/skim operation and secondary readout of the prior $(j-1)$th sensor element are being carried out.

The introduction of the clear/skim step in the subsequent sensor element readout interval, permits one to use a suitably low nodal capacitance to optimize the noise performance and still avoid the penalty of leaving charge in the potential well after readout.

The voltage waveforms produced during the reading of the jth sensor element and the clear/skim operation of the (j−1)th sensor element are illustrated in FIG. 5C. The successive electrical states of the sensor element are illustrated in the V/Q diagram of FIG. 5B, while the equivalent circuit of the sensor element is provided in FIG. 5A.

FIG. 5A equivalently represents the sensor element as a two terminal, four component device. The capacitance of the oxide layer CO is illustrated connected in series with the capacitance of the depletion layer, CD, at the interface between the oxide and the InSb substrate. The capacitance CD is shunted by an ideal diode (D) in series with a variable voltage (VD). The shunting elements are attributable to the stored charge in the potential well created by a suitable reverse bias (VR). The equivalent circuit implies that when the variable potential well disappears, the battery VD, back biasing the diode (D) will also disappear. This allows the diode to be conductive for current flowing into the substrate, and to act as a short circuit in shunt with CD.

The readout circuit including the elements for primary and secondary readout and the clear/skim operation as applied to a single sensor element (the jth element) up to the point of connection to the double section CDS circuit are illustrated in the remainder of FIG. 5A. The bias voltage source VR and the individual reset switch S1$_j$ are connected in shunt to the sensor terminals. Similarly, the secondary select switch S4$_j$ is connected in a circuit which includes the clear/skim switch S9 and the bias reset switch S10. More particularly, one terminal of the switch S4$_j$ is connected to the node at the ungrounded terminal of the jth sensor element and the other terminal is connected to a node at the input of preamplifier A3 associated with the secondary sensing line (SLS). At the node at the A3 input, a first series circuit to ground comprises the voltage source VC and the clear/skim switch S9, and a second series circuit to ground comprises the bias voltage source VR and the bias reset switch S10. The node at the ungrounded terminal of the jth sensor element is then connected through the primary select switch S2$_j$ to the node associated with the primary sensing line PLS and the input of the preamplifier A1. The source of reset voltage VR and the reset switch S3 are serially connected between PLS and ground, with the capacitance CA, being connected between the primary sense line and ground.

The lines in FIGS. 5B and 5C represent the voltage/charge (V/Q) states, and voltage/time (V/T) states respectively of the affected sensor element. In FIG. 5C, the time scale allows for two readout intervals ($t_p$). In FIG. 5B, the solid lines interconnected to form a closed four sides figure represent the successive states of the jth sensor in the V/Q diagram during primary readout operation, while the dashed lines interconnected to form a closed four sided figure represent the successive states of the jth sensor in the V/Q diagram during clear/skim operation.

In FIG. 5C the trace which includes the two pulses rising from the VR pedestal during the two intervals depicted, represents the voltage on the jth sensor element as a function of time. During primary read of the jth sensor element, S2$_j$ interconnecting the jth sensor element with the primary sensing line (PSL) is closed and the injection pulse phi I is coupled through CI to the PSL, causing the voltage on the sensor element to rise. The leading edge of the coupled injection voltage is loaded down from VI' (the unloaded injection voltage as shown in FIG. 5C) by the charge in the potential well, while the trailing edge has a constant amplitude equal to VI'. In primary readout, the taking of the first sample is shown at S5, and the taking of the second sample is shown at S6.

In FIG. 5C, the dashed lines which appear as pulses rising from the VR pedestal during the right most readout interval represent the voltage on the jth sensor element as a function of time for clear/skim operation. The secondary readout, as earlier described, is represented by solid lines commencing at the end of the dashed pulse representing clear/skim operation.

In secondary readout, the bias reset switch S10 is opened and the taking of the first sample is shown at S7 (slightly after the opening of S10) and the taking of the second sample is shown at S8, occurring slightly before the end of the secondary read interval.

During the time the secondary switch S4$_j$ is closed, (the $Q_{j+1}$ waveform of duration $t_s$), the clear/skim switch S9 is first turned on for about 0.5 microsecond by the timing phi C. The voltage VC, suitable for clearing out the remaining charge, is applied to the jth sensor element. With the clear/skim switch S9 turning off, the secondary reset switch S10 is turned on for another 0.5 microsecond applying the reset voltage VR to the secondary sensing line. The first sample of the secondary readout is also completed during the reset time (S10) by closing the DC restore switch S7. The second sample is taken by closing the switch S8 right before the secondary switch (S4$_j$) is turned off. The time between the first and second sample (S7 and S8) is the effective integration time for the secondary readout ($t_{si}$). By adjusting the secondary readout integration time $t_{si}$, the dynamic range can be extended by a factor of $t_{pi}/t_{si}$, $t_{pI}$ being the primary readout integration time, $t_{pi}=(n\ t_p-t_d)$, where $t_p$ is the pixel readout time and $t_d$ is the dead time, as illustrated in FIG. 2.

The CDS, as earlier indicated, is of conventional design and contains two sections which are independent, the first of which consists of the elements C5, S5, A2, S6, C6 which lead to the primary readout terminal (PTO). The input of the first circuit is derived from the output of the amplifier A1 coupled to the primary sensing line. The signal is coupled via capacitor C5 to the amplifier A2 with the input of the amplifier A2 being periodically switched to the reference voltage under the control of the timing waveform marked S5 on the timing generator. The output of the amplifier A2 is connected to the switch S6 under the control of the timing generator output terminal labeled S6. A capacitor C6 is coupled to the output of the switch S6 to store the signal which appears there.

FIG. 6 depicts the jth element of the sensor including the depletion region and the sensing gate together with the essential circuitry in the state for secondary readout. More particularly, a voltage VS is provided, coupled between the semiconductor substrate and ground. The secondary select switch S4$_j$ is closed, connecting the gate to the secondary sensing line and to the input of the preamplifier A3. A shunt capacitance representing the total capacitance that appears at the secondary sensing line and ground. The switches S9 and S10 are open. With the switches in this state for secondary readout, the voltage VS creates a positive potential between the substrate and the gate which is capacitively coupled to the capacitor CS via the closed switch S4$_j$. The voltage VS, typically about 10 volts, insure formation of a depletion region in the sensor element.

Secondary readout operation is initiated when photon induced electron-hole pairs are created in the upper portion of the element mostly within the depletion region.

The integration period starts at the end of $t_d$ which represents the end of reset by phi SR. As shown in both FIGS. 2 and 5C, the first sample for secondary readout is taken during the pulse S7, which coincides with phi SR. The integration period ends with the taking of the second sample at time S8 (FIGS. 2 and 5C), at the end of the select period ($t_S$) which ends with the reset pulse phi R.

During the integration period for secondary readout, the potential VS, acting through the capacitance CS and closed switch S4$_j$ attracts electrons to the substrate and holes to the semiconductor surface under the gate. Image electrons are then created at the gate. Electron image charges accumulated at the gate, draw current from the secondary sensor line via switch S4$_j$. Charge is withdrawn from the shunt capacitance CS at the input of the preamplifier A3 and a signal voltage proportional to the charge integrated during secondary readout appears at the input of preamplifier A3. Due to the much shorter integration time at the secondary sensor line SLS than at the primary sensing line PLS, a signal that would overload the primary readout appears demagnified by the factor $t_{pi}/t_{si}$, the ratio of the respective integration times. For a sensor in which n equals 64, the demagnification is approximately 100. Simultaneous readout permits an extension of the dynamic range of the CID by two orders of magnitude at the signal processor.

Figure 4:
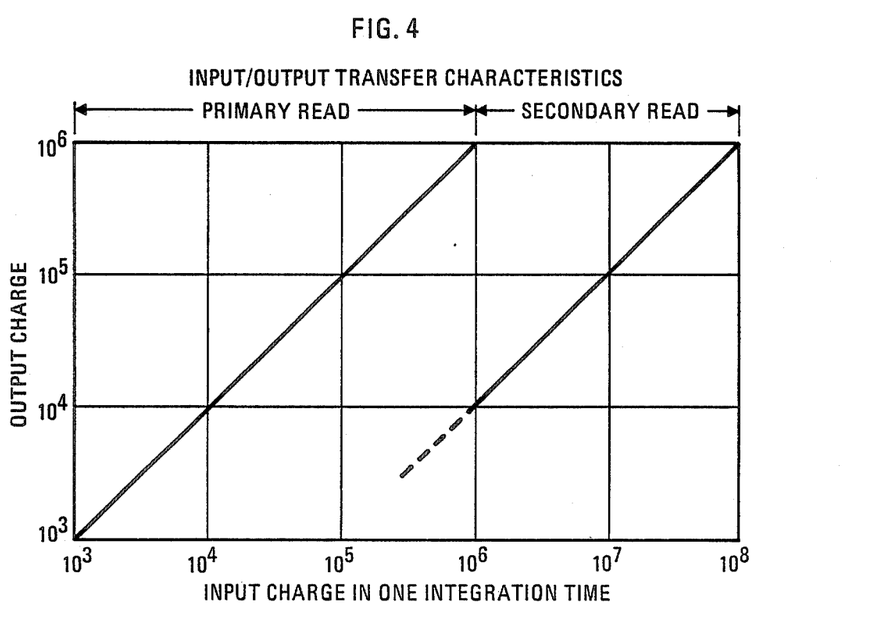
FIG. 4 is a graph of the input/output transfer characteristics of the CID device at the outputs of the primary and secondary readout circuits.

A graph of the input/output transfer characteristics of the CID sensor is illustrated in FIG. 4. The intregrated input charge in one integration time ($t_{pi}$) is the independent variable while the output charge is the dependent variable. Primary readout continues over the range of from $10^3$ to $10^6$ carriers, while secondary readout continues from $10^6$ to $10^8$ carriers.

In processing the primary and secondary readout signal, one or the other is used from each pixel in making up the final display. If the signal at a pixel does not exceed the saturation threshold ($Q_{sat}$) the secondary readout signal is ignored. If the primary signal approaches saturation, then the secondary readout signal is substituted in the display and amplified by the appropriate factor (e.g. 100) to achieve linearity in the output display.

Figure 3:
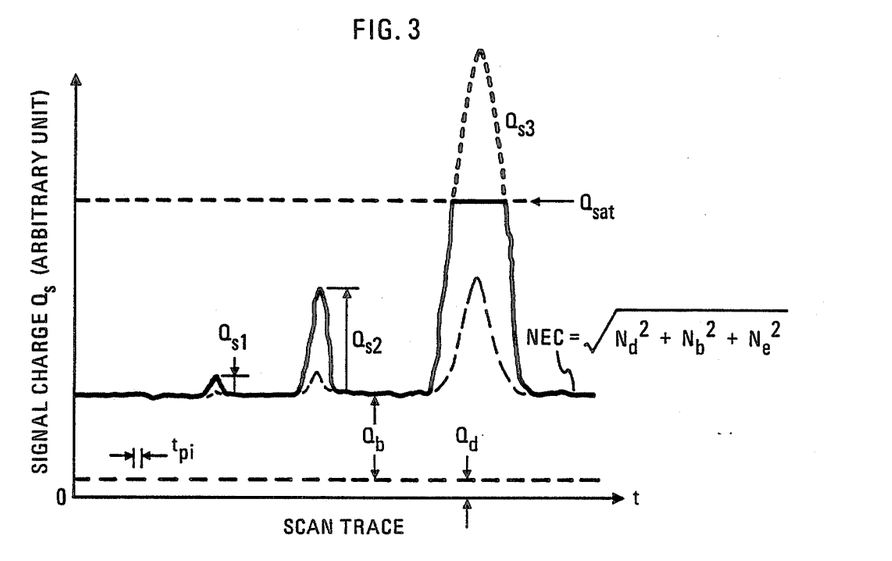
FIG. 3 is a graph of the response of the CID device to signals of respectively low, intermediate, and high signal strength.

A graph illustrating the response of the CID sensor over the noise threshold (NEC) for primary and secondary readout is illustrated in FIG. 3. The independent variable is time, while the dependent variable is signal charge ($Q_s$) in arbitrary units. The response for primary readout continues to be sensitive for low level signals (e.g. $Q_{s1}$ and $Q_{s2}$) until the saturation level (e.g. $Q_{s3}$) as illustrated by the solid lines of the graph. The reponse for secondary readout is shown in a dotted line indicating insensitivity at all signal levels but a continuing linear proportionality even to a signal of the size of $Q_{s3}$. The lower amplitude of the saturating signal as it appears in the secondary readout is made up by amplification, as earlier noted, in subsequent signal processing.

The invention has been described so far using the novel dynamic range enhancement readout of the sensor with AC-coupled injection (ACI). The dynamic range enhancement readout is also applicable to DC-coupled injection (DCI).

What is claimed is:

1. In a charge injection device (CID) for optical sensing having an extended dynamic range, the combination comprising A. n optical sensor elements ($E_{1-n}$) arranged in an array on a substrate, each element when reversely biased and suitably pulsed, forming a potential well in which optically induced charges may be stored, the charge which accumulates with the bias disconnected causing a reduction in depth of said potential well, the depth of which may be reestablished by periodically resetting said bias over a prolonged charge integration period, said optically induced charge being detectable after periodic resetting by application of an injection pulse adequate to collapse said potential well, or detectable without injection until the sensor element is reset, B. a readout circuit, comprising (1) n input terminals ($IT_{1-n}$) each connected to one of said n sensor elements ($E_{1-n}$), a first node including a primary sensing line (PLS), a second node including a secondary sensing line (SLS), and a primary (PTO) and a secondary (STO) signal output, (2) (i) a first voltage source (VR) suitable for reversely biasing said sensor elements, (ii) n parallel bias reset switches ($S1_{1-n}$), each for connecting a corresponding sensor element to said first voltage source (VR), (iii) a primary reset switch (S3) for connecting said primary sensing line to said first voltage source (VR); and (iv) a secondary reset switch (S10) for connecting said secondary sensing line to said first voltage source (VR), (3) n primary select switches ($S2_{1-n}$) for connecting successive sensor elements to said primary sensing line for primary readout, (4) n secondary select switches ($S4_{1-n}$) for connecting successive sensor elements to said secondary sensing line for secondary readout, (5) primary pulse injection means (CI) for application of said injection pulse coupled to said primary sensing line and via said primary select switch ($S2_j$) to each (jth) sensor element for removing stored charge from said selected element, the leading edge of said injection pulse collapsing the potential well, and the trailing edge of said injection pulse reestablishing said potential well, (6) a first and second correlated double sampling circuit (CDS) connected respectively to said primary (PLS) and said secondary (SLS) sensing lines for providing a primary (PTO) and a secondary (STO) readout signal, (7) timing means including (i) a scanning shift register connected to control said primary ($S2_{1-n}$) and said secondary ($S4_{1-n}$) select switch for establishing a primary and a secondary select interval respectively for each (jth) sensor element, the secondary select interval of the jth sensor element occurring during the primary select interval of the (j+1)th sensor element, and (ii) a timing generator for timing the operation of said scanning shift register, said switches, said charge injection means (CI), and said correlated double sampling circuits, said primary sensing line in each sensor element readout interval ($t_p$) after resetting, being connected to said jth sensor element via primary select switch $S2_j$ during the primary select interval, said jth sensor element being successively sampled by said first correlated double sampling circuit, pulsed by said primary charge injection means (CI), and resampled by said first correlated double sampling circuit to provide said primary readout signal (PTO), the charge integration period for primary readout being approximately (n−1) sensor element readout intervals with resetting occurring every sensor element readout interval for sensitive low signal operation, said secondary sensing line in each sensor element readout interval ($t_p$), after resetting, being connected to said (j−1)th sensor element via secondary select switch $S4_{j-1}$ during the secondary select interval, said (j−1)th sensor element being twice sampled by said second double sampling circuit over a charge integration period ($t_{si}$) to provide said secondary readout signal (STO), the charge integration period for secondary readout taking place within a single sensor element readout interval for unsaturated large signal operation.

2. The combination set forth in claim 1 having in addition thereto (8) (i) a second voltage source (VC) having a value in excess of said first voltage source (VR) selected to remove charge remaining after primary readout to a clear or clear and skim condition, (ii) a clear/skim switch (S9) for connecting said secondary sensing line to said second voltage source (VR), and wherein said timing generator times the operation of said clear/skim switch (S9), said secondary sensing line in each sensor element readout interval ($t_p$), after resetting, being connected to said (j−1)th sensor element via secondary select switch $S4_{(j-1)}$ during the secondary select interval, said (j−1)th sensor element being successively cleared or cleared and skimmed, reset, and twice sampled by said double sampling circuit.

3. In a charge injection device (CID) for optical sensing having an extended dynamic range, the combination comprising A. n optical sensor elements ($E_{1-n}$) arranged in an array on a substrate, each element when reversely biased and suitably pulsed, forming a potential well in which optically induced charges may be stored, the charge which accumulates with the bias disconnected causing a reduction in depth of said potential well, the depth of which may be reestablished by periodically resetting said bias over a prolonged charge integration period, said optically induced charge being detectable after periodic resetting by application of an injection pulse adequate to collapse said potential well, or detectable without injection until the sensor element is reset, B. A readout circuit, comprising (1) n input terminals ($IT_{1-n}$) each connected to one of said n sensor elements ($E_{1-n}$), a first node including a primary sensing line (PLS), a second node including a secondary sensing line (SLS), and a primary (PTO) and a secondary (STO) signal output, (2) means for periodically resetting said sensor elements and said primary and secondary sensing lines to said reverse bias, (3) primary pulse injection means (CI) for application of said injection pulse coupled to said primary sensing line and periodically to each (jth) sensor element for removing stored charge from said selected element, the leading edge of said injection pulse collapsing the potential well, and the trailing edge of said injection pulse reestablishing said potential well, (4) a primary (PTO) and a secondary (STO) readout means connected respectively to said primary (PLS) and said secondary (SLS) sensing lines, (5) timed switching means for establishing a primary and a secondary select interval respectively for each (jth) sensor element, the secondary select interval of the jth sensor element occurring during the primary select interval of the (j+1)th sensor element, said primary sensing line in each sensor element readout interval ($t_p$), after resetting, being connected to said jth sensor element during the primary select interval, said jth sensor element being successively sampled for primary readout, pulsed by said primary charge injection means (CI), and resampled for primary readout to provide said primary readout signal (PTO), the charge integration period for primary readout being approximately (n−1) sensor element readout intervals with resetting occurring every sensor element readout interval for sensitive low signal operation, said secondary sensing line in each sensor element readout interval ($t_p$), after resetting, being connected to said (j−1)th sensor element during the secondary select interval, said (j−1)th sensor element being twice sampled by said secondary readout means over a charge integration period ($t_{si}$) to provide said secondary readout signal (STO), the charge integration period for secondary readout taking place within a single sensor element readout interval for unsaturated large signal operation.

4. The combination set forth in claim 3 having in addition thereto (6) means for periodically removing charge remaining after primary readout to a clear or clear and skim condition, said secondary sensing line in each sensor element readout interval ($t_p$), after resetting, being connected to said (j−1)th sensor element during the secondary select interval, said (j−1)th sensor element being successively cleared or cleared and skimmed, reset, and twice sampled by said double sampling circuit.

* * * * *